United States Patent
Wang et al.

(10) Patent No.: US 10,177,058 B1
(45) Date of Patent: Jan. 8, 2019

(54) ENCAPSULATING COMPOSITION, SEMICONDUCTOR PACKAGE AND MANUFACTURING METHOD THEREOF

(71) Applicant: Powertech Technology Inc., Hsinchu County (TW)

(72) Inventors: Ming-Yi Wang, Hsinchu County (TW); Kun-Yung Huang, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/880,557

(22) Filed: Jan. 26, 2018

(51) Int. Cl.
| H01L 23/52 | (2006.01) |
| H01L 23/29 | (2006.01) |
| H01L 23/31 | (2006.01) |
| H01L 23/485 | (2006.01) |
| H01L 21/56 | (2006.01) |
| H01L 21/48 | (2006.01) |
| H01L 25/065 | (2006.01) |

(52) U.S. Cl.
CPC ........ *H01L 23/293* (2013.01); *H01L 21/4846* (2013.01); *H01L 21/563* (2013.01); *H01L 21/568* (2013.01); *H01L 23/3128* (2013.01); *H01L 23/485* (2013.01); *H01L 25/0657* (2013.01); *H01L 2225/0652* (2013.01); *H01L 2225/06548* (2013.01)

(58) Field of Classification Search
CPC ......... H01L 21/484621; H01L 21/4828; H01L 21/563; H01L 21/568; H01L 23/3128; H01L 23/485; H01L 23/293
USPC .......................................................... 257/737
See application file for complete search history.

(56) References Cited

U.S. PATENT DOCUMENTS 7,384,279 B2 * 6/2008 Igarashi ............... G01R 1/0735
439/66
7,608,147 B2 * 10/2009 Samuelson ............ B82Y 10/00
117/12
7,935,414 B2    5/2011 Ounaies et al.

FOREIGN PATENT DOCUMENTS

CN    100341629    10/2007
TW    I511208      12/2015

* cited by examiner

*Primary Examiner* — Luan C Thai
(74) *Attorney, Agent, or Firm* — JCIPRNET

(57) ABSTRACT

An encapsulating composition and a semiconductor package are provided. The encapsulating composition adapted to encapsulate a semiconductor die includes a photosensitive dielectric material and a polarizable compound suspended in the photosensitive dielectric material. The polarizable compound within a predetermined region of the encapsulating composition affected by an external stimulus is arranged uniformly in a thickness direction to provide a conductive path penetrating through the photosensitive dielectric material along the thickness direction. The semiconductor package includes the encapsulating composition encapsulating the semiconductor die, a first and a second redistribution layer. The first and the second redistribution layer disposed on the opposite sides of the encapsulating composition are electrically connected each other through the encapsulating composition. A manufacturing method of the semiconductor package is also provided.

20 Claims, 8 Drawing Sheets

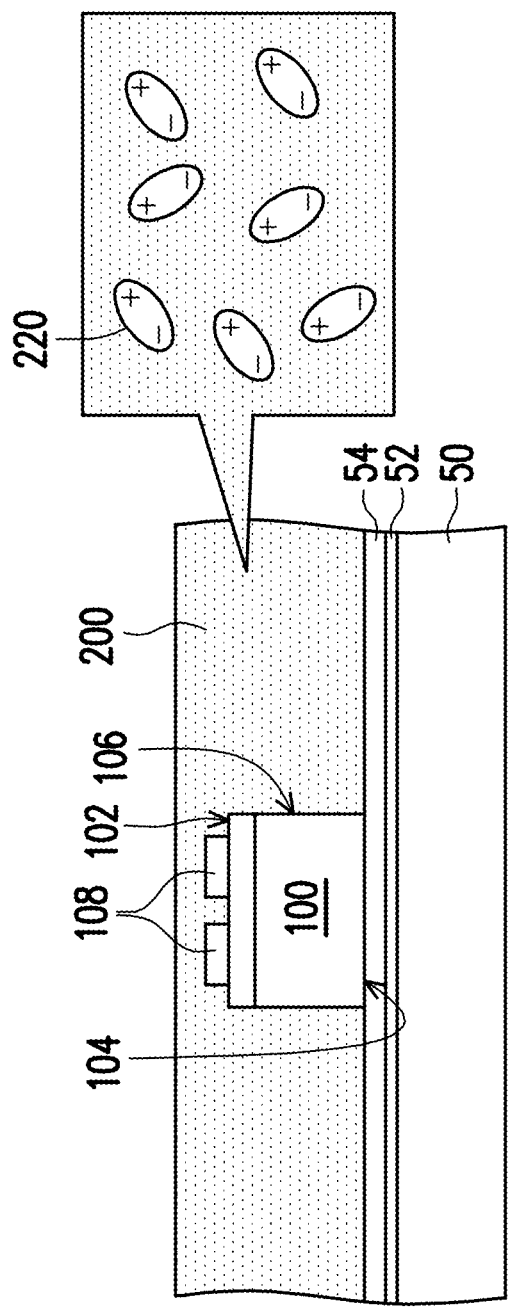

ENCAPSULATING COMPOSITION, SEMICONDUCTOR PACKAGE AND MANUFACTURING METHOD THEREOF

BACKGROUND OF THE INVENTION

Field of Invention

The present disclosure relates to an encapsulating composition, a package structure and a manufacturing method thereof, and more particularly, to a encapsulating composition for encapsulating a semiconductor die, a semiconductor package including such encapsulating composition, and a manufacturing method of the semiconductor package.

Description of Related Art

In certain categories of conventional packaging technologies, such as fan-out wafer level packaging (FO-WLP), it takes a long time to form copper pillars using plating process. In addition, after plating process, a semiconductor chip is encapsulated by a molding compound and then the molding compound is grinded to expose the copper pillars for further electrical connection. However, since it is difficult to control the grinding depth, the copper pillars are often over-grinded or unexposed. Moreover, due to materials difference between the molding compound and the chip, a warpage issue may be generated during the manufacturing process of the semiconductor package. Therefore, development of the manufacturing process to avoid the aforementioned issues has become an important topic in the field.

SUMMARY OF THE INVENTION

The disclosure provides an encapsulating composition, a semiconductor package and a manufacturing method thereof, which simplifies the manufacturing process and reduces the warpage issue.

The disclosure provides an encapsulating composition adapted to encapsulate a semiconductor die. The encapsulating composition includes a photosensitive dielectric material and a polarizable compound suspended in the photosensitive dielectric material. The polarizable compound within a predetermined region of the encapsulating composition affected by an external stimulus is arranged uniformly in a thickness direction to provide a conductive path penetrating through the photosensitive dielectric material along the thickness direction.

The disclosure provides a semiconductor package including a semiconductor die, the aforementioned encapsulating composition, a first redistribution layer and a second redistribution layer. The encapsulating composition encapsulates the semiconductor die. The first redistribution layer is disposed on a first surface of the encapsulating composition and electrically connected to the encapsulating composition and the semiconductor die. The second redistribution layer is disposed on a second surface of the encapsulating composition opposite to the first surface and electrically connected to the first redistribution layer through the encapsulating composition.

The disclosure provides a manufacturing method of a semiconductor package. The method includes the following steps. A semiconductor die is encapsulated by an encapsulating composition. A predetermined region of the encapsulating composition is polarized to form a conductive path surrounding the semiconductor die. A first redistribution layer is formed on a first surface of the encapsulating composition to electrically connect the conductive path in the encapsulating composition and the semiconductor die. A second redistribution layer is formed on a second surface of the encapsulating composition opposite to the first surface to electrically connect the conductive path in the encapsulating composition.

Based on the above, the semiconductor die is encapsulated by the encapsulating composition. The encapsulating composition includes a polarizable compound which provides conductive paths after certain processes. Therefore, the conventional molding process and copper plating process are omitted such that the simplicity of manufacturing process is achieved and the warpage issue is reduced.

To make the above features and advantages of the present disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1B:
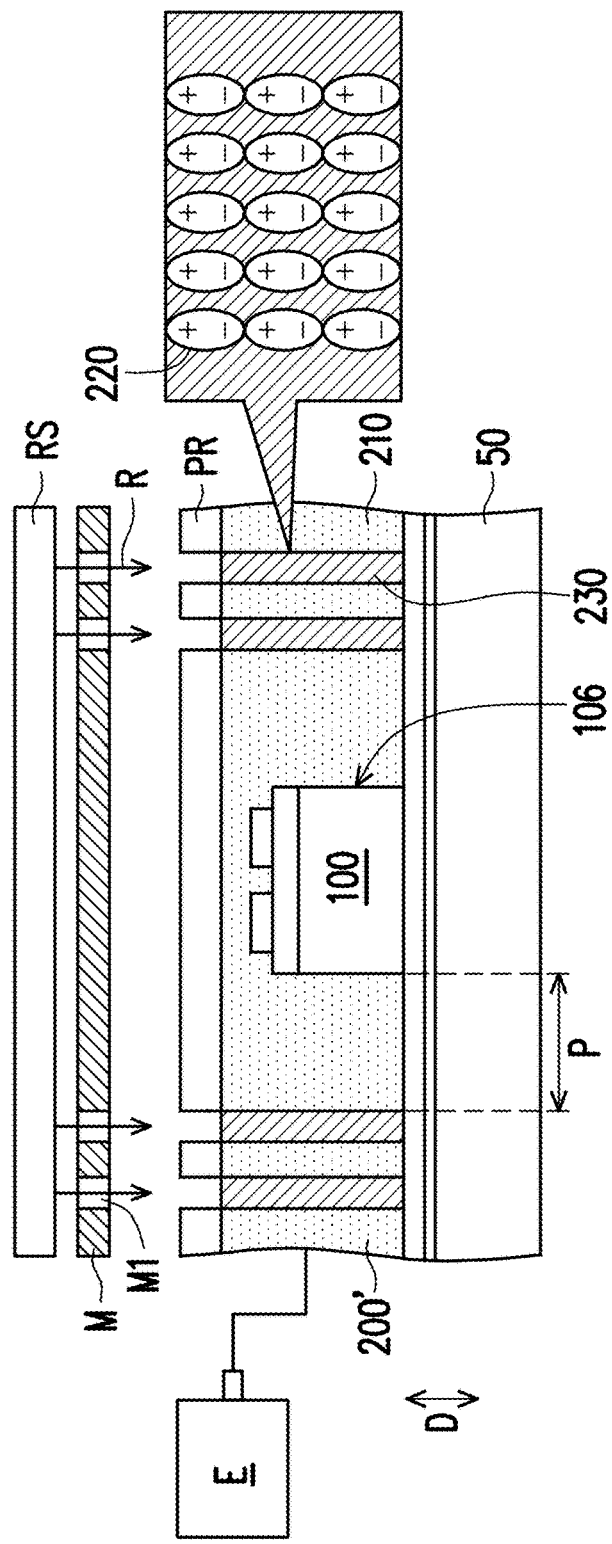
FIG. 1A to FIG. 1N are schematic cross-sectional views illustrating a manufacturing method of a semiconductor package according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Figure 1C:
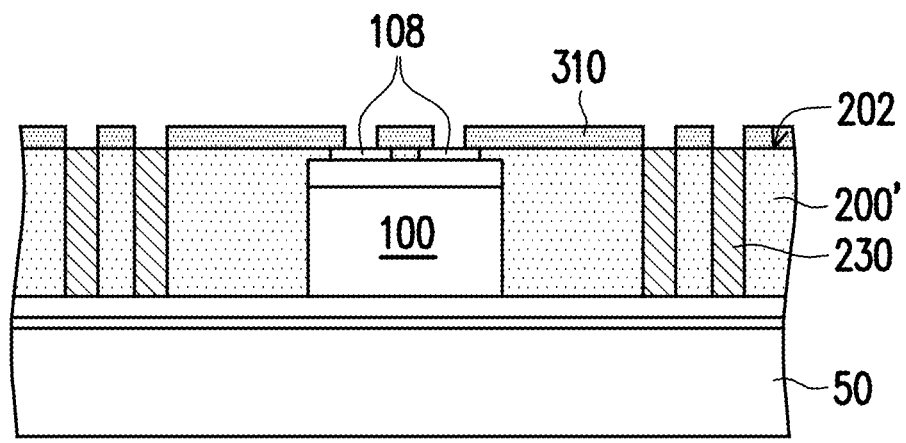
Figure 1D:
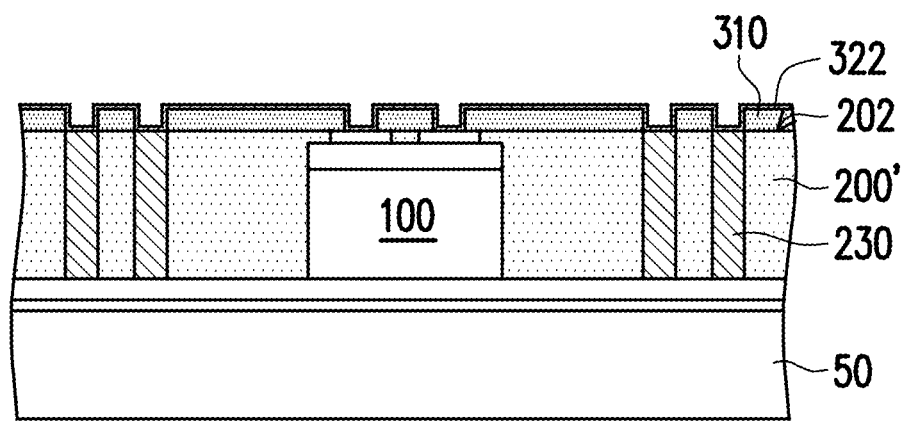
Figure 1E:
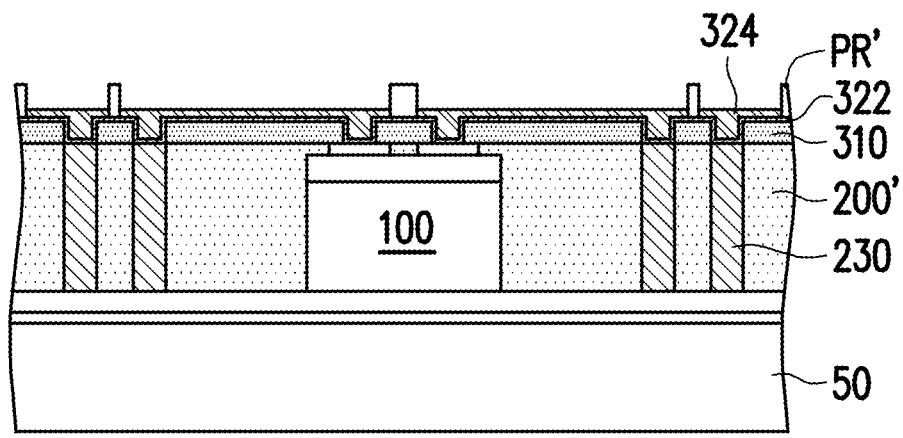
Figure 1F:
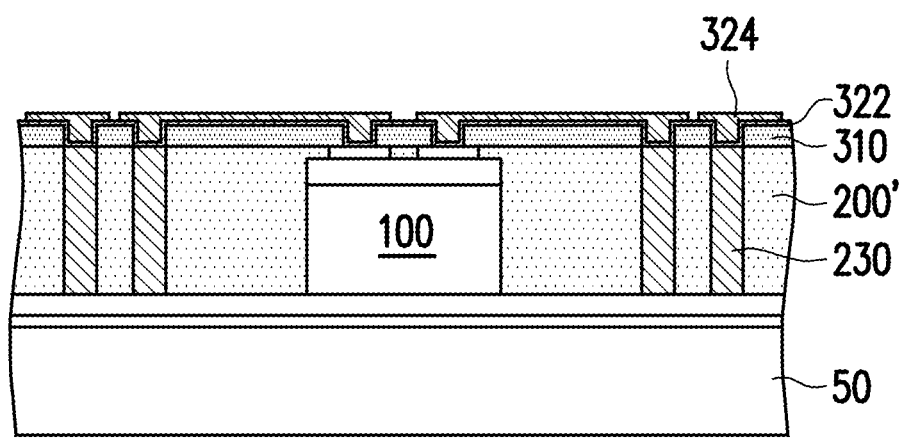
Figure 1G:
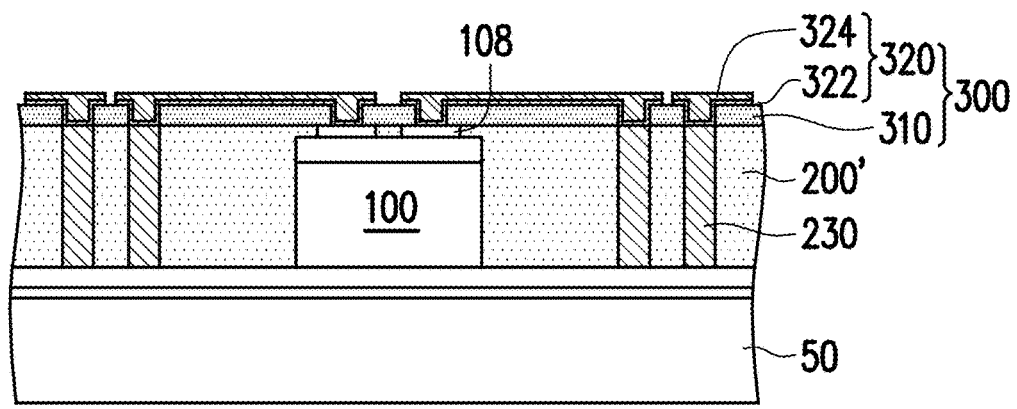
Figure 1H:
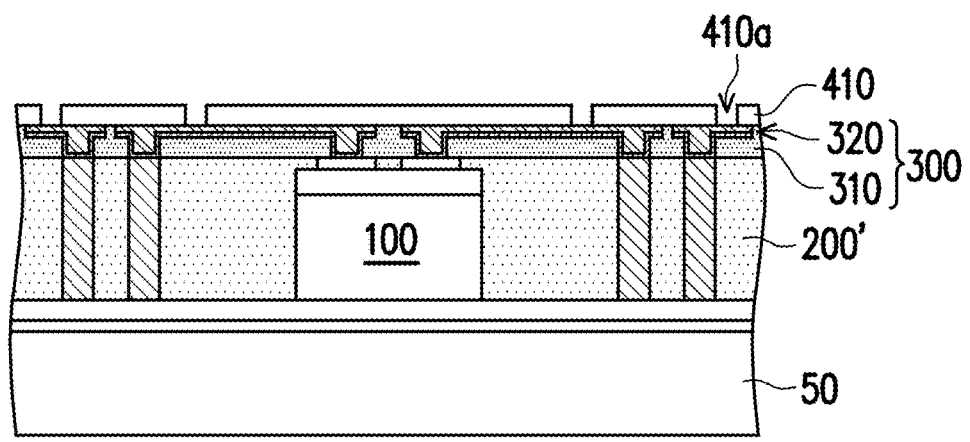
Figure 1I:
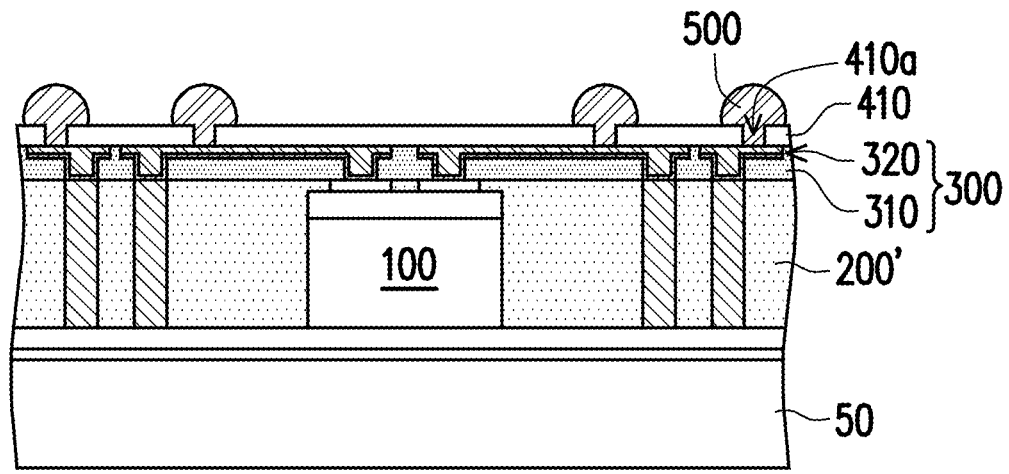
Figure 1J:
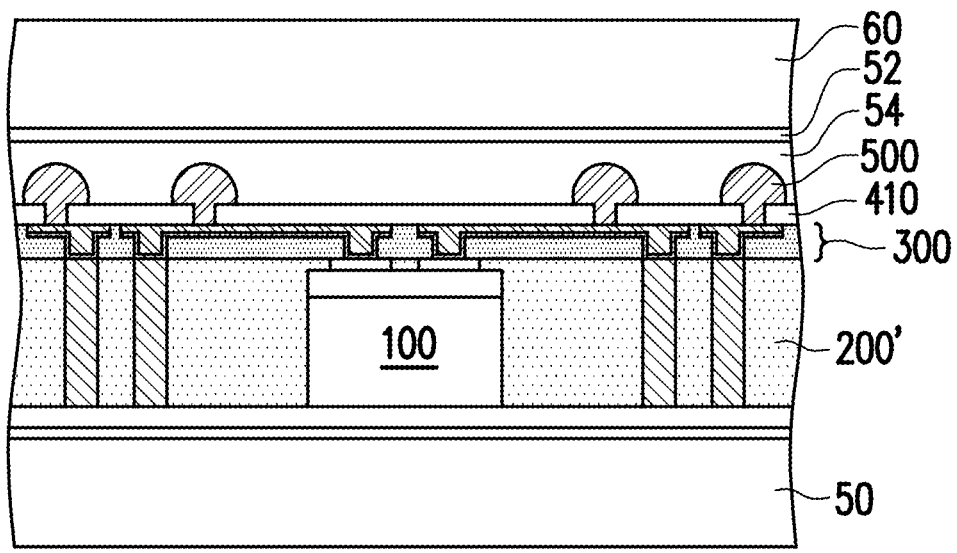
Figure 1K:
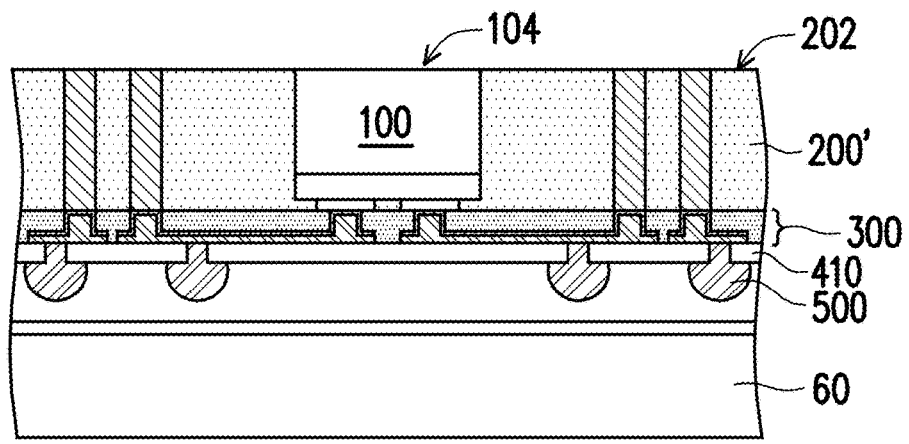
Figure 1L:
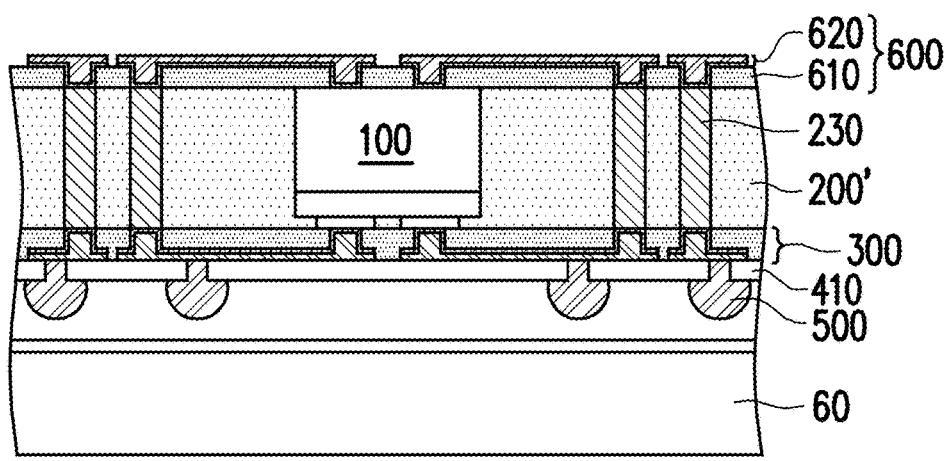
Figure 1M:
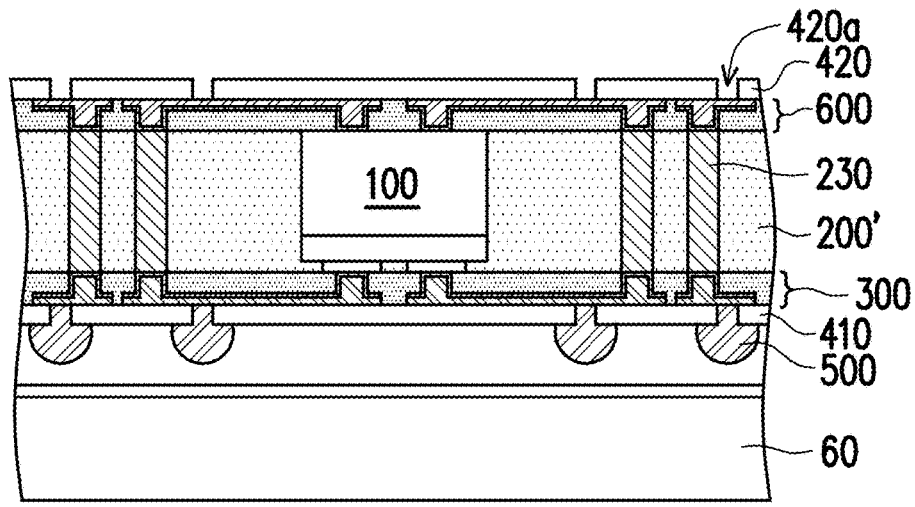
Figure 1N:
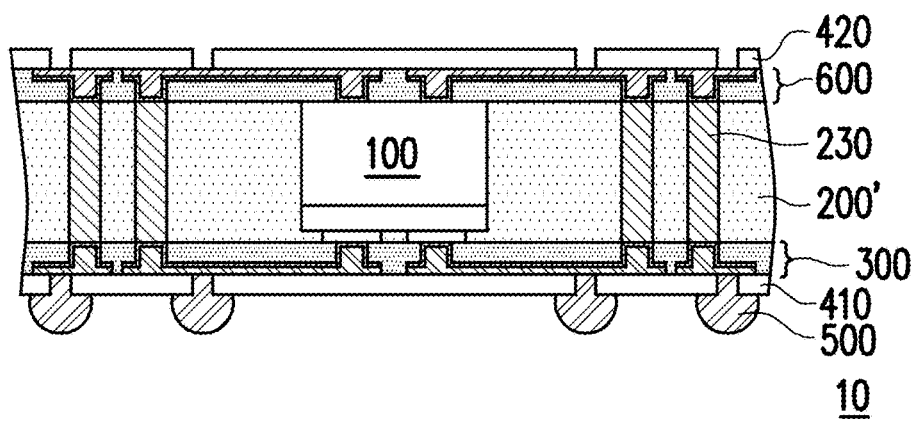

FIG. 1A to FIG. 1N are schematic cross-sectional views of a semiconductor package illustrating a manufacturing method of the said semiconductor package according to an embodiment of the disclosure. Referring to FIG. 1A, a semiconductor die 100 is encapsulated by an encapsulating composition 200. The semiconductor die 100 may include an active surface 102, a back surface 104 opposite to the active surface 102, a lateral side 106 disposed between the active surface 102 and the back surface 104, and a plurality of conductive bumps 108 disposed on the active surface 102. The semiconductor die 100 may be a silicon die (e.g. ASIC or MEMS). Other suitable active devices may also be utilized as the semiconductor die 100. In some embodiments, the semiconductor die 100 is attached on a first temporary carrier 50. The first temporary carrier 50 may be made of glass, plastic, or other suitable materials as long as the material is able to withstand the subsequent processes while carrying the semiconductor package formed thereon. A release layer 52 may be formed on the first temporary carrier 50 before disposing the semiconductor die 100 to enhance the releasability for the subsequent process. The release layer 52 may be a LTHC (light to heat conversion) release layer or other suitable release layers. In some embodiments, an adhesive layer 54 is formed on the release layer 52 to attach the back surface 104 of the semiconductor die for enhancing the attachment. In some other embodiments, the semiconductor die 100 is in contact with the first temporary carrier 50 directly.

After disposing the semiconductor die 100 on the first temporary carrier 50, the encapsulating composition 200 may be formed on the first temporary carrier 50 to encapsulate the semiconductor die 100 using deposition, such as spin coating, or other suitable process.

The encapsulating composition 200 may be uniform in composition and may be formed as a homogeneous mixture. In some other embodiments, the encapsulating composition 200 may be a heterogeneous mixture. The encapsulating composition 200 may include a photosensitive dielectric material 210 and a polarizable compound 220. The polarizable compound 220 may be suspended in the photosensitive dielectric material 210 in an initial state. The initial state may be referred to as the unexcited condition. The polarizable compound 220 and the photosensitive dielectric material 210 are may be homogeneously mixed in the initial state. The polarizable compound 220 may be homogenously distributed throughout the encapsulating composition 200. In some embodiments, the encapsulating composition 200 may include the photosensitive dielectric material 210 and the polarizable compound 220 in the same proportion. The amount of the photosensitive dielectric material 210 with respect to the total volume of the encapsulating composition 200 may range from about 30% to about 40%. In some other embodiments, the encapsulating composition 200 may include a higher proportion of the polarizable compound 220 greater than 50% by volume, for example, ranging from about 60% to about 70% by volume. The encapsulating composition 200 containing a higher proportion of the polarizable compound 220 may obtain a high reliability of electrical conductivity.

In some embodiments, the photosensitive dielectric material 210 may include polyimide, curable resin, or the like. In some embodiments, the coefficient of thermal expansion (CTE) of the photosensitive dielectric material 210 may be close to the material of the semiconductor die 100 to minimize effects of the CTE mismatch and reduce the warpage issue. The polarizable compound 220 may include anisotropic conductive particles, nanostructures, or the combination thereof. The anisotropic conductive particles may exhibit electrical conductivity in only one direction, for example, the direction parallel to a thickness direction D (which is also referred to as Z-direction). The anisotropic conductive particles may be found in a variety of shapes (e.g., spherical, ellipsoidal, cylindrical, etc.), which is not limited thereto. The mean particle size of the anisotropic conductive particles may substantially range from 10 nm to 10 μm which can achieve conductive characteristics in the subsequent processes. The mean particle size of the anisotropic conductive particles may vary depending on the design requirement of the pitches between the conductive paths used for connection.

When the nanostructures are mixed with the anisotropic conductive particles, the polarizable compound 220 may include the nanostructures at about 10% by volume and the anisotropic conductive particles at about 40% by volume of the encapsulating composition 200. In some other embodiments, the polarizable compound 220 may include a concentration of the nanostructures exceed 10% by volume. The polarizable compound 220 may include about 20% to about 35% by volume of nanostructures and about 30% to about 35% by volume of anisotropic conductive particles.

The nanostructures which can be subject to high magnetic and electric polarization may be mixed with the anisotropic conductive particles in the encapsulating composition 200. In some embodiments, the nanostructures may be based on a variety of elements, including carbon or other metallic elements, such as Ag, Au, Cu, Al, W, Co, or the like. Carbon nanotubes, such as single-wall nanotubes (referred to as "SWNT") or multiple walls nanotubes (referred to as "MWNT") may be applied. In some embodiments, the concentrations of the nanostructures may range from 0, or just greater than 0.00% (e.g., 0.01%) to approximately 35.0% volume fractions. A higher concentration of the polarizable compound 220 in the encapsulating composition 200 enables the polarizable compound 220 to behave better as conductive paths in the subsequent process. The electrical conductivity of the encapsulating composition 200 can be varied and controlled by the volume fraction of polarizable compound 220. Suitable thickness of the encapsulating composition 200 can vary significantly depending on the intended application. In instances of semiconductor package, a suitable thickness of the encapsulating composition 200 may substantially ranges from 5 μm to 2000 μm. The encapsulating composition 200 in the initial state may haves a relatively low electrical resistivity, which may range from about 1 to 1000 M Ohm/cm$^2$.

Referring to FIG. 1B, after forming the encapsulating composition 200, a predetermined region of the encapsulating composition 200 is affected by additional energy such that conductive paths 230 are formed in the predetermined region. The conductive paths 230 may penetrate through the photosensitive dielectric material 210 along the thickness direction D. Such additional energies may be the result of external stimuli from different environment surrounding the encapsulating composition 200. For example, the additional energy imparted to the encapsulating composition 200 may be in the form of electrical, radiant, thermal energy, etc.

For example, an external electric field covering the predetermined region is generated by an electrical stimulation unit E. A metal mask (not illustrated) may be used as a shield to cover the other region, such as the region where the semiconductor die is located, or the region which is not subjected to the external electric field. For example, a material of the metal mask includes lead, aluminum, copper, chromium, alloys (e.g. iron, manganese, nickel, copper, chromium, or the like), or other suitable metal materials. In other embodiments, an electrical polarization probe (not illustrated) of the electrical stimulation unit E may be moved to the predetermined region directly to perform electrical polarization without covering the other region.

When the external electric field is applied to the predetermined region of the encapsulating composition 200, molecules in the predetermined region gain electric dipole moment, thereby causing a displacement of elements in the polarizable compound 220. Positive charged elements are displaced in the direction of the electric field, and negative charged elements are displaced opposite to the direction of the electric field. In other words, the predetermined region of the encapsulating composition 200 surrounding the semiconductor die 100 is polarized to make the polarizable compound 220 arranged uniformly in the thickness direction D such that the conductive paths 230 are formed in the predetermined region due to the z-axis anisotropy material (e.g. anisotropic conductive particles). In some embodiments, the direct current electric field may be employed. The strength of the electric field may substantially range from 0.1 V/m to 100 V/m. By adjusting the duration time, the amount of the electrical stimulation may be adjusted. For the relatively low stimulation intensity, the duration time may be increased for continuous stimulation, and for the relatively high stimulation intensity, the duration time may be decreased according to the design requirements. A critical dimension of the conductive paths 230 formed in the encapsulating composition 200 may be adjusted, controlled and/or optimized to meet pattern requirements. The various dimensions of the conductive paths may be obtained by adjusting the process parameters. A horizontal pitch between an edge of the predetermined region facing toward the semiconductor die 100 and the lateral side 106 of the semiconductor die 100 may range from about 100 µm to about 1.0 mm to protect the semiconductor die 100 from being affected during electric polarization.

During electric polarization of the encapsulating composition 200, the exposure process is performed on the predetermined region of the encapsulating composition 200 to harden the conductive paths 230. The encapsulating composition 200 may be exposed to a pattern of radiation by projecting radiation R from a radiation source RS through a mask M using, for example, a lithography system. A layer of photoresist PR may be formed on the encapsulating composition 200. In some embodiments, the photoresist PR may be a negative-tone photoresist for negative-tone pattern development as shown in FIG. 1B. The layer of the photoresist PR may have exposed portions that are exposed to radiation R and unexposed portions that are not exposed to the radiation R. The transparent portions M1 of the mask M are imaged onto the layer of photoresist PR to produce corresponding photoresist features aligned with exposed portions. The intervals between the exposed portions are determined according to intervals between transparent portions M1 of the mask M. In some other embodiments, a positive-tone photoresist may be applied depending on the design requirements.

After electric polarization and exposure, the developing process is performed on the encapsulating composition 200 wherein the removal of non-irradiated regions occurs (as in the case of negative-tone photoresist). After removing the layer of photoresist PR, the exposed portions which have been irradiated form a pattern transferred from mask M to the encapsulating composition 200. In some other embodiments, the positive-tone photoresist may be applied on the encapsulating composition 200 to perform the lithography process. In such embodiments, the developing process is performed, during which the removal of the irradiated regions of the encapsulating composition 200 occurs (as in the case of positive-tone photoresist).

The encapsulating composition 200 may be cured and a patterned encapsulating composition 200' including conductive paths 230 may be substantially completed. The use of heat, UV, or a combination thereof may be used to cure the encapsulating composition 200. For example, the encapsulating composition 200 has a cure onset temperature (e.g. the room temperature to about 150° C.)., below which no curing takes places. Heating the encapsulating composition 200 to a temperature above the cure onset temperature may initiate curing. For example, the heating temperature may range from about 160° C. to about 300° C. In some embodiments, after performing electric polarization and lithography processes on the encapsulating composition 200 to film the conductive paths 230, the conductive paths 230 may be thermally conductive so that heat may spread via the conductive paths 230 within the encapsulating composition 200. The spread of heat may cause a temperature rise in the encapsulating composition 200 to a temperature above the cure onset temperature. Upon application of heat, the encapsulating composition 200 undergoes chemical bonding such that a hard, rigid structure of encapsulating composition 200' is formed. In some embodiments, after electric polarization and lithography process, the electrical resistivity in the predetermined region (i.e. conductive paths 230) may substantially range from 1 to 100 Ohm/cm². The electrical conductivity may be evaluated by measuring conduction performance in the thickness direction D. The processed region of the encapsulating composition 200' may have a higher electrical conductivity. In other unprocessed region of the encapsulating composition 200', the polarizable compound 220 may be insulated by the photosensitive dielectric material 210. As such, the processed region of the encapsulating composition 200' may have a lower electrical resistivity than other unprocessed region of the encapsulating composition 200'. Since the encapsulating composition 200 may have the predetermined region become conductive paths 230 after processing while other region of the encapsulating composition 200' maintain insulating property, the conventional copper plating process may be omitted such that the manufacturing cost and the process time may be effectively lowered.

Referring to FIG. 1C through FIG. 1G, a first redistribution layer 300 is formed on a first surface 202 of the encapsulating composition 200'. Referring to FIG. 1C, in some embodiments, a thickness of the encapsulating composition 200' may be reduced to expose the conductive bumps 108 of the semiconductor die 100 using a chemical-mechanical polishing process, a mechanical grinding process, or other suitable thinning process. After the conductive bumps 108 are exposed from the encapsulating composition 200', the first redistribution layer 300 including a dielectric layer 310 and a patterned conductive layer 320 are formed. A dielectric material may be formed over the first surface 202 of the encapsulating composition 200'. Next a portion of the dielectric material may be removed to form the dielectric layer 310. The dielectric layer 310 may expose at least a portion of the conductive paths 230 and the conductive bumps 108.

Referring to FIG. 1D and FIG. 1E, a seed layer 322 may be conformally fainted over the dielectric layer 310 by a deposition process, or other suitable process. A patterned resist layer PR' may be formed on the seed layer 322 to cover portions of the seed layer 322. Next, a conductive layer 324 may be formed on the seed layer 322 exposed from the patterned resist layer PR' by plating process, or other suitable process. After forming the conductive layer 324, the patterned resist layer PR' is stripped from the seed layer 322 as shown in FIG. 1F. Subsequently, the seed layer 322 exposed from the conductive layer 324 are removed to form the patterned conductive layer 320 by etching process, or other suitable process as shown in FIG. 1G. The patterned conductive layer 320 may be electrically connected to the conductive paths 230 of the encapsulating composition 200' and the conductive bumps 108 of the semiconductor die 100. In some other embodiments, the patterned conductive layer 320 may be formed before the dielectric layer 310. The forming sequence of the patterned conductive layer 320 and the dielectric layer 310 may depend on the design requirement, which is not limited thereto. The aforementioned steps may be performed multiple times to obtain a multi-layered first redistribution layer 300 as required by the circuit design.

Referring to FIG. 1H and FIG. 1I, after forming the first redistribution layer 300, a first passivation layer 410 may be formed on the first redistribution layer 300 opposite to the encapsulating composition 200' for protection. The first passivation layer 410 may have a plurality of openings 410a exposing at least a portion of the patterned conductive layer 320. A material of the first passivation layer 410 may include epoxy, polyimide, polybenzoxazole (PBO), benzocyclobutene (BCB), or other suitable material. Conductive terminals 500 may be formed on the first passivation layer 410 corresponding to the openings 410a using a plating process, a ball placement process, or other suitable process. In some embodiments, the conductive terminals 500 may be in direct contact with the patterned conductive layer 310 and electrically connected to the first redistribution layer 300. The conductive terminals 500 may include conductive balls, conductive pillars, conductive bumps or a combination thereof. However, it construes no limitation in the disclosure. Other possible forms and shapes of the conductive terminals 500 may be utilized according to the design requirement. A soldering process and a reflowing process are optionally performed for enhancement of the adhesion between the conductive terminals 500 and the patterned conductive layer 310.

Referring to FIG. 1J and FIG. 1K, after forming the conductive terminals 500, a second temporary carrier 60 may be attached to the conductive terminals through the adhesive layer 54. In some embodiments, the release layer 52 may be disposed between the adhesive layer 54 and the second temporary carrier 60 to enhance the releasability therebetween. Subsequently, the first temporary carrier 50 may be removed. An external energy such as UV laser, visible light or heat may be applied between the first temporary carrier 50 and the encapsulating composition 200' to peel off the layers (e.g. release layer 52 and adhesive layer 54). After removing the first temporary carrier 50, a second surface 204 of the encapsulating composition 200' and the back surface 104 of the semiconductor die 100 coplanar to the second surface of the encapsulating composition 200' are exposed.

Referring to FIG. 1L, a second redistribution layer 600 is formed on the second surface 204 of the encapsulating composition 200'. The second redistribution layer 600 may include a dielectric layer 610 and a patterned conductive layer 620. The patterned conductive layer 620 may be electrically connected to the first redistribution layer 300 through the conductive paths 230 of the encapsulating composition 200'. The forming process of the second redistribution layer 600 may be similar to the first redistribution layer 300, and the detail descriptions are omitted for brevity.

Referring to FIG. 1M, a second passivation layer 420 may be formed on the second redistribution layer 600 opposite to the encapsulating composition 200'. In some embodiments, the second passivation layer 420 may include a plurality of openings 420a exposing at least a portion of the patterned conductive layer 620 for further electrical connection. The second passivation layer 420 may be similar with the first passivation layer 410, and the detail descriptions are omitted for brevity.

Referring to FIG. 1N, the second temporary carrier 60 may be removed. The manufacturing process of a semiconductor package 10 is substantially completed. An external energy such as UV laser, visible light or heat may be applied between the second temporary carrier 60 and the conductive terminals 500 to peel off the layers (e.g. release layer 52 and adhesive layer 54).

Based on the foregoing, the semiconductor die is encapsulated by the encapsulating composition which may serve as the insulating encapsulant and provide conductive paths after certain processes. In addition, the various dimensions of the conductive paths may be obtained by adjusting the process parameters. As such, the conventional copper plating process may be omitted and the manufacturing process of the semiconductor package is simplified. Moreover, the encapsulating composition may minimize effects of the CTE mismatch and the warpage issue may be reduced.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. An encapsulating composition adapted to encapsulate a semiconductor die, comprising:
   a photosensitive dielectric material; and
   a polarizable compound suspended in the photosensitive dielectric material,
   wherein the polarizable compound within a predetermined region of the encapsulating composition affected by an external stimulus is arranged uniformly in a thickness direction to provide a conductive path penetrating through the photosensitive dielectric material along the thickness direction.

2. The encapsulating composition according to claim 1, wherein the polarizable compound comprises anisotropic conductive particles and the amount of the polarizable compound with respect to the total volume of the encapsulating composition ranges from 50% to 70%.

3. The encapsulating composition according to claim 2, wherein the polarizable compound further comprises a carbon nanostructure mixed with the anisotropic conductive particles.

4. The encapsulating composition according to claim 1, wherein the external stimulus comprises radiant energy, electrical energy and thermal energy.

5. A semiconductor package, comprising:
   a semiconductor die;
   an encapsulating composition according to claim 1 encapsulating the semiconductor die;
   a first redistribution layer disposed on a first surface of the encapsulating composition, the first redistribution layer electrically connected to the encapsulating composition and the semiconductor die; and
   a second redistribution layer disposed on a second surface of the encapsulating composition opposite to the first surface, the second redistribution layer electrically connected to the first redistribution layer through the encapsulating composition.

6. The semiconductor package according to claim 5, wherein the first redistribution layer and the second redistribution layer are electrically connected through the conductive path provided by the predetermined region of the encapsulating composition affected by the external stimulus.

7. The semiconductor package according to claim 6, wherein the semiconductor die is surrounded by the conductive path of the encapsulating composition.

8. The semiconductor package according to claim 5, further comprising:
   a conductive terminal disposed on the first redistribution layer opposite to the encapsulating composition and electrically connected to the first redistribution layer.

9. The semiconductor package according to claim 5, wherein the semiconductor die comprises an active surface and a plurality of conductive bumps distributed on the active surface, the encapsulating composition exposes at least a portion of the conductive bumps, and the first redistribution layer is electrically connected to the portion of the conductive bumps.

10. The semiconductor package according to claim 9, wherein a back surface of the semiconductor die opposite to the active surface is exposed from the encapsulating composition, and a surface of the encapsulating composition is coplanar with the back surface of the semiconductor die.

11. A manufacturing method of a semiconductor package, comprising:
    encapsulating a semiconductor die by an encapsulating composition, wherein the encapsulating composition comprises a photosensitive dielectric material and a polarizable compound mixed in the photosensitive dielectric material;
    polarizing a predetermined region of the encapsulating composition to form a conductive path surrounding the semiconductor die;
    forming a first redistribution layer on a first surface of the encapsulating composition to electrically connect the semiconductor die and the conductive path in the encapsulating composition; and
    forming a second redistribution layer on a second surface of the encapsulating composition opposite to the first surface to electrically connect the conductive path in the encapsulating composition.

12. The manufacturing method according to claim 11, further comprising:
    exposing the predetermined region of the encapsulating composition during polarizing;
    developing the encapsulating composition after exposing; and
    curing the encapsulating composition after developing.

13. The manufacturing method according to claim 12, wherein the predetermined region of the encapsulating composition after exposure and polarization has a lower electrical resistivity than other region of the encapsulating composition.

14. The manufacturing method according to claim 12, wherein the semiconductor die comprises a plurality of conductive bumps, the manufacturing method further comprising:
    thinning a thickness of the encapsulating composition to expose the conductive bumps of the semiconductor die after curing the encapsulating composition.

15. The manufacturing method according to claim 14, wherein after thinning the thickness of the encapsulating composition, the first redistribution layer is formed and electrically connected to the conductive bumps of the semiconductor die exposed from the encapsulating composition.

16. The manufacturing method according to claim 11, wherein a horizontal pitch between a lateral side of the semiconductor die and the predetermined region of the encapsulating composition ranges from about 0.5 mm to 1.0 mm during polarizing.

17. The manufacturing method according to claim 11, wherein before polarizing the predetermined region of the encapsulating composition, the polarizable compound is suspended in the photosensitive dielectric material.

18. The manufacturing method according to claim 11, wherein after polarizing the predetermined region of the encapsulating composition, the polarizable compound is arranged uniformly in a thickness direction to form the conductive path penetrating through the photosensitive dielectric material along the thickness direction.

19. The manufacturing method according to claim 11, further comprising:
    forming a conductive terminal on the first redistribution layer opposite to the encapsulating composition before forming the second redistribution layer.

20. The manufacturing method according to claim 11, wherein encapsulating the semiconductor die by the encapsulating composition comprises disposing the semiconductor die on a temporary carrier and forming the encapsulating composition on the temporary carrier to encapsulate the semiconductor die, and the manufacturing method further comprises removing the temporary carrier before forming the second redistribution layer.

\* \* \* \* \*